United States Patent
Eiki

(10) Patent No.: US 7,609,526 B2
(45) Date of Patent: Oct. 27, 2009

(54) CIRCUIT BOARD

(75) Inventor: Shunsuke Eiki, Kanagawa (JP)

(73) Assignee: Meiko Electronics Co., Ltd., Ayase-Shi (JP)

( * ) Notice: Subject to any disclaimer, the term of this patent is extended or adjusted under 35 U.S.C. 154(b) by 0 days.

(21) Appl. No.: 11/230,336

(22) Filed: Sep. 20, 2005

(65) Prior Publication Data

US 2006/0109635 A1    May 25, 2006

(30) Foreign Application Priority Data

Sep. 24, 2004  (JP) ............................ 2004-277845
Aug. 29, 2005  (JP) ............................ 2005-247930

(51) Int. Cl.
H05K 7/00 (2006.01)
(52) U.S. Cl. ...................... 361/760; 361/763; 361/766; 174/261; 174/262
(58) Field of Classification Search ................ 361/760, 361/761, 790, 157, 763, 764–765, 766; 174/260, 174/261, 262, 263; 257/728
See application file for complete search history.

(56) References Cited

U.S. PATENT DOCUMENTS

| 3,675,095 | A |   | 7/1972 | Lehmann |
| 4,339,668 | A |   | 7/1982 | Meuller et al. |
| 4,581,301 | A | * | 4/1986 | Michaelson .................. 428/551 |
| 4,774,634 | A | * | 9/1988 | Tate et al. .................... 361/760 |
| 5,412,538 | A | * | 5/1995 | Kikinis et al. ................ 361/792 |
| 5,428,190 | A | * | 6/1995 | Stopperan .................... 174/261 |
| 5,774,341 | A | * | 6/1998 | Urbish et al. ................ 361/774 |
| 6,266,227 | B1 |   | 7/2001 | Konushi et al. ........... 361/306.1 |
| 6,730,573 | B1 | * | 5/2004 | Ng et al. ...................... 438/381 |
| 2002/0176989 | A1 | * | 11/2002 | Knudsen et al. ............. 428/408 |
| 2003/0071349 | A1 | * | 4/2003 | Hirose ........................ 257/728 |
| 2003/0076660 | A1 | * | 4/2003 | Horie ......................... 361/760 |
| 2004/0160751 | A1 | * | 8/2004 | Inagaki et al. ............... 361/763 |
| 2005/0047101 | A1 | * | 3/2005 | Osanai ....................... 361/760 |
| 2006/0050491 | A1 | * | 3/2006 | Hayashi et al. ............. 361/760 |

FOREIGN PATENT DOCUMENTS

DE        196 33 923 A1    2/1998

(Continued)

OTHER PUBLICATIONS

"Decoupling Capacitor Incorporated in Printed Circuit Board" IBM Technical Disclosure Bulletin, IBM Corp. New York, US, vol. 33, No. 10A, Mar. 1, 1991, p. 424, XP0001100110; ISBN: 0018-8689.

(Continued)

Primary Examiner—Dean A. Reichard
Assistant Examiner—Abiy Getachew
(74) Attorney, Agent, or Firm—Frishauf, Holtz, Goodman & Chick, P.C.

(57) ABSTRACT

A circuit board including a capacitor structure formed on a surface of an insulating substrate, wherein the capacitor structure includes paired linear conductive layers arranged on the surface of the insulating substrate, parallel to each other with a predetermined distance between them, and a dielectric material filled in a groove defined by those surfaces of the paired linear conductive layers which face each other and the surface of the insulating substrate.

6 Claims, 2 Drawing Sheets

FOREIGN PATENT DOCUMENTS

| | | |
|---|---|---|
| FR | 2 371 053 | 6/1978 |
| GB | 811295 | 4/1959 |
| JP | 04-208591 A | 7/1992 |
| JP | 5-500136 A | 1/1993 |
| JP | 08-172029 A | 7/1996 |
| JP | 09-092952 A | 4/1997 |
| JP | 2004-296985 A | 10/2004 |
| WO | WO 91/02647 A1 | 3/1991 |

OTHER PUBLICATIONS

Japanese Office Action dated Feb. 18, 2009 issued in a counterpart Japanese Application No. 2005-247930.

* cited by examiner

CIRCUIT BOARD

BACKGROUND OF THE INVENTION

1. Field of the Invention

This invention relates to a circuit board having a new structure which includes a capacitor structure in itself.

2. Description of the Related Art

Regarding electric/electronic devices, multifunctionalization and reduction in size, weight and thickness have been advancing rapidly. In this connection, regarding circuit boards to be incorporated in such devices, there is a demand for such circuit boards that allow higher-density mounting of components and have a more multilayered structure.

To meet this demand, for example, efforts have been being made to provide a circuit board arranged such that the board itself has functions of components which are normally mounted, to reduce the number of components mounted on the surface of the circuit board to thereby allow the circuit board to have a smaller mounting surface.

Regarding a circuit board having the function of a capacitor in itself, for example, technology disclosed in PCT Application Published Japanese Translation No. Hei 5-500136 is known.

The circuit board disclosed in this prior art document has the following structure: Within an insulating substrate having a certain plane size and a certain thickness, two conductive layers having the same plane size as the insulating substrate are arranged one over the other in the direction of the thickness of the insulating substrate, parallel to each other with a predetermined distance between them, and a layer of a dielectric material is inserted between the two conductive layers.

Thus, in this circuit board, the insulating substrate contains a parallel plate capacitor structure which is formed of the two parallel conductive layers functioning as electrodes and the dielectric-material layer inserted between them and which has the same area as the insulating substrate.

The capacitor structure in this prior-art document has, however, the following problems:

First, it is difficult to increase the capacitance of the capacitor structure contained.

In the above-described structure, provided that the upper and lower conductive layers have a fixed area, the capacitance of the capacitor structure can be increased by making the distance between the conductive layers smaller.

Making the distance between the conductive layers smaller means making the dielectric-material layer inserted between the conductive layers uniformly thinner. However, practically, it is difficult to make the dielectric-material layer uniformly thinner. Hence, the dielectric-material layer formable has a thickness limit.

According to common knowledge of those skilled in the art, the above-described structure is formed by, for example, spin-coating the surface of the lower conductive layer with the dielectric material and then forming the upper conductive layer on the dielectric-material coating.

However, generally, the thinner the coating to be formed, the more difficult it is to form the coating with a uniform thickness. Hence, in order to ensure that the coating formed has a uniform thickness, the coating needs to have a certain measure of thickness.

Second, the dielectric-material layer is far lower in strength than the insulating substrate which is normally made of a composite material such as glass fiber reinforced epoxy resin. Since the dielectric-material layer of such low strength extends within the insulating substrate over its transverse cross-sectional area, the insulating substrate as a whole has a lowered strength and cannot provide sufficient reliability when used as a circuit board.

The third problem relates to the fact that the dielectric-material layer is formed with the same plane size as the insulating substrate.

Practically, there are cases such that it is desired to connect a capacitor only with a certain component mounted on the surface of the circuit board. In such cases, it is enough to form a capacitor structure near that particular component, locally.

However, in the above-described circuit board, the capacitor structure has to be formed within the insulating substrate, over the transverse cross-sectional area of the insulating substrate. Hence, only a part of the capacitor structure formed is used effectively, and the other part thereof is useless.

SUMMARY OF THE INVENTION

An object of this invention is to solve the above-mentioned problems with the prior art and provide a circuit board including a capacitor structure whose capacitance can be increased theoretically infinitely without having adverse effects on the strength of the insulating substrate, and which can be formed in any desired place on the surface of the circuit board.

In order to achieve the above object, this invention provides a circuit board comprising a capacitor structure integrally formed on a surface of an insulating substrate, in which a conductive circuit can be formed on that surface of the insulating substrate at the same time.

In one aspect of this invention, the circuit board comprises a capacitor structure including paired linear conductive layers formed on a surface of an insulating substrate, parallel to each other with a predetermined distance between them, and a dielectric material filled in a groove defined by those surfaces of the paired linear conductive layers which face each other and the surface of the insulating substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
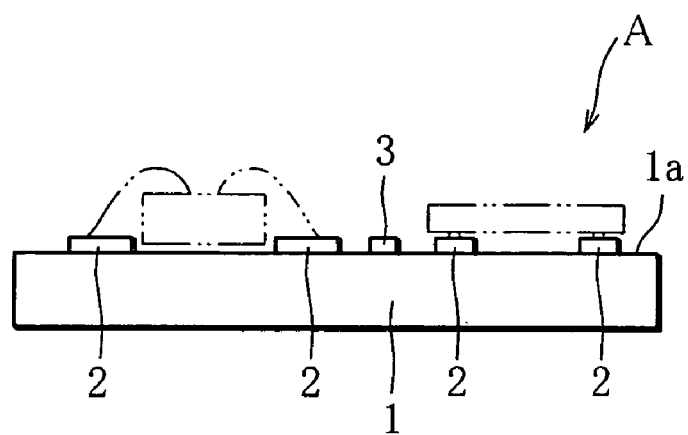
FIG. 1 is a conceptual diagram showing example A of a circuit board according to this invention.

FIG. 1 is a conceptual diagram showing an example of a circuit board according to this invention.

In this circuit board, a conductive circuit 2 is formed on a surface (upper surface in FIG. 1) 1a of an insulating substrate 1 according to a predetermined circuit pattern. As indicated by the two-dot chain line, various types of components are mounted and integrated with the conductive circuit 2.

The most important feature of this circuit board is that a capacitor structure 3 is formed on the surface 1a on which the conductive circuit 2 is formed.

Figure 2:
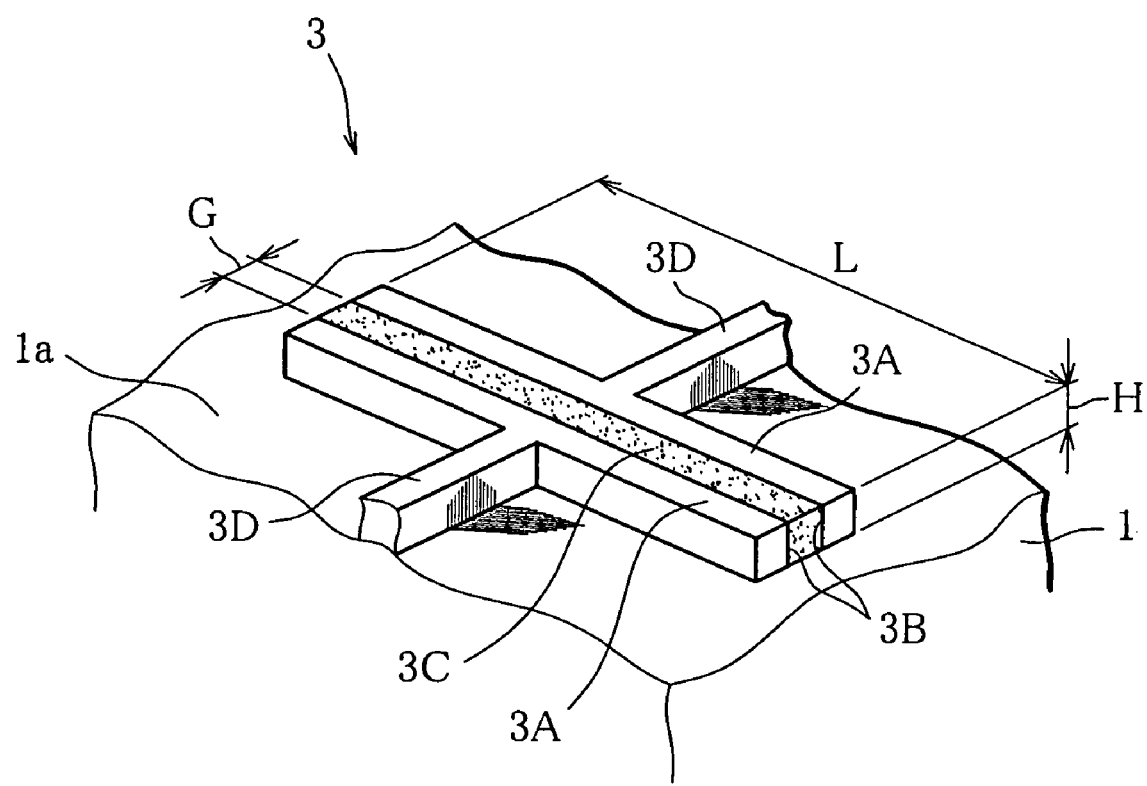
FIG. 2 is a perspective view showing an example of a capacitor structure according to this invention.

FIG. 2 shows an example of the capacitor structure.

In the capacitor structure 3, paired linear conductive layers 3A, 3A are formed on the surface 1a of the insulating substrate 1, parallel to each other with a predetermined distance G between them. The surfaces 3B, 3B of the linear conductive layers 3A, 3A which face each other are parallel to each other. Thus, the paired linear conductive layers 3A, 3A and the surface 1a of the insulating substrate 1 define a minute groove of width G. The groove is filled with a dielectric material 3C. Leads 3D, 3D are attached to the linear conductive layers 3A, 3A in an integrated manner, respectively.

Thus, the capacitor structure 3 is a parallel plate capacitor formed on the surface 1a of the insulating substrate 1 in which the paired liner conductive layers 3A 3A function as electrodes.

In this capacitor structure 3, provided that the layer height of the linear conductive layers 3A, 3A is H and the overall length of each of them is L, the area (S) of each of the facing surfaces 3B, 3B is H×L.

Provided that the distance between the facing surfaces of the linear conductive layers 3A, 3A is G and the relative dielectric constant of the dielectric material filled in the space of width G is $\epsilon$, the capacitance of the capacitor structure 3 is:

$$C = \epsilon \cdot H \times L / G \quad (1).$$

Hence, the capacitance of the capacitor structure 3 can be varied by varying the values of H, L and G.

The capacitor structure 3 can be formed at the same time as the conductive circuit is formed on the circuit board.

For example, when a conductive circuit having a predetermined pattern should be formed from a copper foil of a copper-laminated plate which is an insulating substrate of glass reinforced epoxy resin with a copper foil stuck on a surface thereof, normally, the surface of the copper foil is masked according to the predetermined pattern using photolithography and then the copper-laminated plate thus masked is subjected to etching.

In this process, the capacitor structure according to the present invention can be formed by masking a predetermined part of the copper foil of the copper-laminated plate, according to the plane pattern of the to-be-formed capacitor structure, using photolithography, at the same time.

By subjecting the copper-laminated plate thus masked to etching, the conductive circuit according to the predetermined pattern and the paired linear conductive layers according to the predetermined plane pattern located in a predetermined place are formed on the surface of the insulating substrate at the same time.

Between the paired linear conductive layers parallel to each other, a minute groove of width G is formed, where the facing surfaces of the paired linear conductive layers form the opposite sides of the minute groove and the surface of the insulating substrate forms the bottom of the minute groove.

Then, in the minute groove of width G between the paired linear conductive layers, a predetermined dielectric material is filled using a technique such as printing or roll coating. As a result, the intended capacitor structure as shown in FIG. 2 is formed on the surface of the insulating substrate.

As understood from the above explanation, the layer height (H) of the paired linear conductive layers 3A, 3A which function as electrodes is the same as the thickness of the copper foil of the copper-laminated plate used.

The overall length (L) of each of the paired linear conductive layers and the distance (G) between them can be determined by the size of a mask pattern used in photolithography.

Hence, for example, by performing photolithography and etching such that the value of G is small and the value of H×L is great, a high-capacitance capacitor structure can be formed at the same time as a conductive circuit is formed.

In order to achieve a high capacitance, a dielectric material having a great relative dielectric constant should be used. As such material, for example, ink made of epoxy resin with barium titanate powder dispersed is suitable.

The dielectric material is, however, not limited to this. For example, organic materials such as epoxy resin, polyimide resin and phenol resin generally used for printed circuit boards can be used.

The technique used for filling the dielectric material into the groove between the liner conductive layers is not limited to printing or roll coating. For example, the filling can be performed by masking the part other than the groove, and depositing epoxy resin, acrylic resin or the like in the groove by electrostatic coating.

Figure 3:
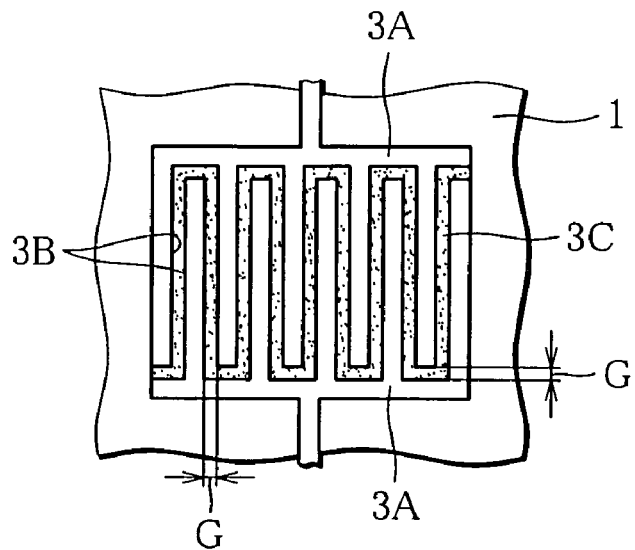
FIG. 3 is a plan view showing another example of the capacitor structure.

FIG. 3 is a plan view showing another example of the capacitor structure according to the present invention.

In this capacitor structure, a groove 3C between the facing surfaces 3B, 3B of paired linear conductive layers 3A, 3A engaged with each other like two combs is filled with a dielectric material 3C. In this capacitor structure, while the overall area of the facing surfaces of the paired linear conductive layers is great, the plane space which the capacitor structure occupies is small. Thus, this capacitor structure has an advantage that it is space-saving and high-capacitance.

Figure 4:
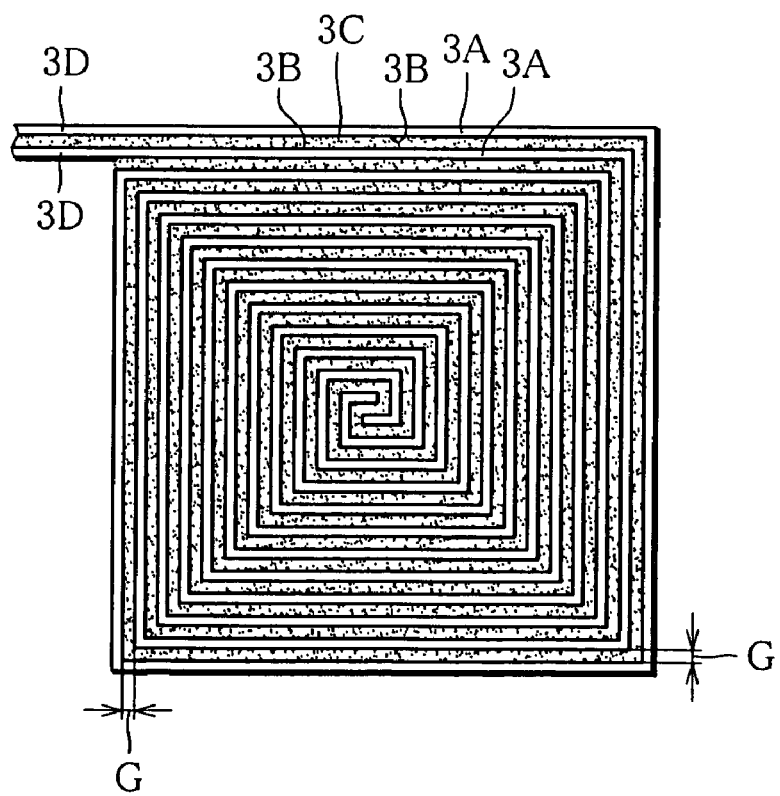
FIG. 4 is a plan view showing another example of the capacitor structure.

FIG. 4 is a plan view showing another example of the capacitor structure according to the present invention.

In this capacitor structure, two linear conductive layers 3A, 3A are in the form of paired square spirals arranged parallel to each other with a distance G between them. In the groove between the paired linear conductive layers, a dielectric material 3C is filled.

Also this capacitor structure occupies a smaller plane space and can have high capacitance.

It is to be noted that a plurality of the described capacitor structures can be formed on the surface of the insulating substrate as necessary. Further, the circuit board according to the present invention can be either a single-layer circuit board or a multi-layer circuit board. In the latter case, the described capacitor structure is formed on at least one of the layers constituting the multi-layer circuit board.

EXAMPLE

A circuit board with paired linear conductive layers according the engaged comb pattern shown in FIG. 3 was made from a copper-laminated plate having a copper foil of thickness 20 μm, using photolithography and etching.

The layer height of the paired linear conductive layers was 20 μm, the distance between them was 20 μm, and the overall length of each of the facing surfaces thereof was 23500 μm. The plane space which the capacitor structure occupied was within a 1 mm square.

Then, dielectric ink of relative dielectric constant 35 (name of article: Interra-PI, from DuPont) was applied and thereby filled into a groove between the facing surfaces of the paired linear conductive layers. Thus, a capacitor structure as shown in FIG. 3 was formed.

It was found that the capacitance of this capacitor structure was about 3.6 pF.

This means that the circuit board had, on its surface, a capacitor having a capacitance of about 3.6 pF and a plane size equal to or smaller than a 1 mm square.

As stated above, in the circuit board according to the present invention, a parallel plate capacitor structure is arranged in a chosen place on that surface of a substrate on which a conductive circuit is formed. The capacitor structure is formed at the same time as the conductive circuit is formed, by photolithography and etching. Hence, the size and shape of the capacitor structure can be freely determined when photolithography is performed.

So, the circuit board having aforedescrived capacitor structure can have a desired capacitance depending on the size and shape of aforesaid capacitor structure. This allows the circuit board to have a smaller mounting surface.

In the circuit board according to the present invention, the capacitor structure is formed independently, on a part of that surface of the insulating substrate on which the conductive circuit is formed. Hence, the presence of the capacitor structure does not have adverse effects on the strength of the insulating substrate as a whole, and the part of the surface of the circuit board other than the part on which the capacitor structure is formed can be used effectively. Further, by selecting, for example, the distance between the opposite sides of the groove defined by the paired linear conductive layers and the surface of the insulating substrate and/or the dielectric material filled in the groove, the circuit board can be made to have a function of a capacitor of desired capacitance.

The invention thus described, it will be obvious that the same may be varied in many ways. Such variations are not to be regarded as a departure from the sprit and scope of the invention, and all such modifications as would be obvious to one skilled in the art are intended to be included within the scope of the following claims.

What is claimed is:

1. A circuit board, comprising:
    an insulating substrate; and
    a capacitor structure formed integrally on a surface of the insulating substrate;
    wherein the capacitor structure includes paired linear conductive layers forming electrodes of the capacitor structure, each of said linear conductive layers is arranged directly in contact with said surface of the insulating substrate such that the paired linear conductive layers are parallel to each other with a predetermined distance therebetween, and each of said linear conductive layers has a facing surface which faces toward the facing surface of the other linear conductive layer;
    wherein a dielectric material is filled in a groove defined by said surface of the insulating substrate and the respective facing surfaces of the paired linear conductive layers which face each other; and
    wherein said respective facing surfaces of the paired linear conductive layers do not face toward said surface of the insulating substrate, and the paired linear conductive layers and the dielectric material are stacked along said surface of the insulating substrate.

2. The circuit board according to claim 1, wherein a conductive circuit is formed on said surface of the insulating substrate at the same time that the linear conductive layers are formed on said surface of the insulating substrate.

3. The circuit board according to claim 1, wherein the circuit board is a single-layer circuit board.

4. The circuit board according to claim 1, wherein the circuit board is a multi-layer circuit board including a plurality of layers, and the capacitor structure is formed on at least one of the plurality of layers.

5. The circuit board according to claim 2, wherein the circuit board is a single-layer circuit board.

6. The circuit board according to claim 2, wherein the circuit board is a multi-layer circuit board including a plurality of layers, and the capacitor structure is formed on at least one of the plurality of layers.

* * * * *